(12) United States Patent
Zhu et al.

(10) Patent No.: US 11,032,926 B2
(45) Date of Patent: Jun. 8, 2021

(54) TRANSMISSION DEVICE USED FOR MONITOR EXPANSION

(71) Applicant: Wei Zhu, Wuxi (CN)

(72) Inventors: Wei Zhu, Wuxi (CN); Wanchun Chen, Wuxi (CN); Yenkang Tsai, Wuxi (CN); Zhong Zhang, Wuxi (CN)

(73) Assignee: Wei Zhu, Jiangyin (CN)

( * ) Notice: Subject to any disclaimer, the term of this patent is extended or adjusted under 35 U.S.C. 154(b) by 381 days.

(21) Appl. No.: 15/779,548

(22) PCT Filed: Dec. 6, 2017

(86) PCT No.: PCT/CN2017/114684
§ 371 (c)(1),
(2) Date: May 29, 2018

(87) PCT Pub. No.: WO2019/109261
PCT Pub. Date: Jun. 13, 2019

(65) Prior Publication Data
US 2021/0120685 A1   Apr. 22, 2021

(51) Int. Cl.
*H05K 5/02* (2006.01)
*F16M 13/00* (2006.01)
(Continued)

(52) U.S. Cl.
CPC .......... *H05K 5/0217* (2013.01); *F16H 21/44* (2013.01); *F16H 21/50* (2013.01); *F16H 25/20* (2013.01); *F16H 37/122* (2013.01); *F16M 13/005* (2013.01); *H05K 5/0017* (2013.01); *F16H 2025/2075* (2013.01)

(58) Field of Classification Search
None
See application file for complete search history.

(56) References Cited

U.S. PATENT DOCUMENTS 7,848,091 B2   12/2010   Han et al.
8,385,055 B2 *  2/2013   Kao ...................... G06F 1/1616
                                                 361/679.06

(Continued)

FOREIGN PATENT DOCUMENTS

TW   201222402 A1   6/2012
TW   201525984 A    7/2015

OTHER PUBLICATIONS

European search report issued in counterpart European Application No. 17889521.5, dated Nov. 5, 2020.

*Primary Examiner* — Xanthia C Cunningham
(74) *Attorney, Agent, or Firm* — Zhu Lehnhoff LLP

(57) ABSTRACT

The present invention discloses a transmission device used for expanding monitors, comprising the body, and a combination of at least a first monitor, a second monitor and an actuation module that can be installed thereon. The actuation module can drive the second monitor to move reciprocally on a reference axis X; and the second monitor is provided with a drive module to drive the second monitor to move reciprocally on a reference axis Y perpendicular to the reference axis X, which jointly provide a mechanism, under which an expansion and combination of the screen of the first monitor and the screen of the second monitor (in the same planimetric position) and/or retraction thereof are enabled.

20 Claims, 15 Drawing Sheets

(51) Int. Cl.
*F16H 37/12* (2006.01)
*F16H 21/44* (2006.01)
*F16H 21/50* (2006.01)
*H05K 5/00* (2006.01)
*F16H 25/20* (2006.01)

(56) References Cited

U.S. PATENT DOCUMENTS

| | | | |
|---|---|---|---|
| 8,860,656 B1* | 10/2014 | Cho | G06F 1/3265 |
| | | | 345/102 |
| 9,442,529 B2* | 9/2016 | Huang | G06F 1/1652 |
| 9,983,618 B2* | 5/2018 | Chen | G06F 3/0416 |
| 10,258,873 B2* | 4/2019 | Wang | G06F 3/03543 |
| 2003/0001795 A1* | 1/2003 | Stasko | F16M 11/22 |
| | | | 345/1.1 |
| 2007/0136405 A1* | 6/2007 | Weinstein | G06F 1/1666 |
| | | | 708/130 |
| 2011/0006971 A1 | 1/2011 | Ebey | |
| 2012/0182295 A1 | 7/2012 | Schilling | |
| 2012/0223872 A1* | 9/2012 | Ram | H04M 1/0266 |
| | | | 345/1.3 |
| 2014/0125553 A1* | 5/2014 | Kim | G06F 1/1647 |
| | | | 345/1.3 |
| 2014/0378183 A1 | 12/2014 | Xiong | |
| 2015/0169274 A1* | 6/2015 | Holung | G06F 3/1423 |
| | | | 345/1.3 |

* cited by examiner

TRANSMISSION DEVICE USED FOR MONITOR EXPANSION

TECHNICAL FIELD

The present invention relates to a transmission device used for expanding monitors; in particular, refers to a technology for establishing a mechanism, under which expansion and combination and/or retraction of a plurality of display screens are enabled.

TECHNICAL BACKGROUND

A technical means of using a plurality of or multiple monitors (or called "display screens") to form a larger-sized screen (or video wall structure) through mutual combination of these monitors for video signal output has already been in existence in prior art. For example, Taiwan Patent No. 99141387 (All-in-One Display Screen for Automatic Switching Display Frames), Patent No. 102147287 relating to technology for superimposition or combination of a plurality of display screens by using command control (A Display Device for Combined Screen Display according to Splice Commands), etc., all of which have provided typical embodiments.

The foregoing methods have disclosed the technology for moving the screen from the saved position to the expanded position by using a plurality of movable screens with the aid of spindle drive; For example, patents US 2005/008463 A1 (EXPANDED DISPLAY FOR CELLPHONE, PALM PILOT OR COMPUTER), U.S. Pat. No. 7,848,091 B2 (DUAL-SCREEN MOBILE DISPLAY DEVICE); US 2012/0182295 A1 (PERSONAL PORTABLE COMMUNICATION DEVICES WITH DEPLOYABLE DISPLAY SYSTEMS FOR THREE DIMENSIONAL VISUAL REPRESENTATIONS AND/OR PRIVACY AND METHODS OF USE), all of which have provided viable embodiments.

Typically speaking, these references have shown the design technology of relevant existing screen devices in respect of structure and application. If a redesign takes into account the structure of the power unit of such monitors or display screens and makes their structure different from the traditional devices, an ideal power drive mechanism can be provided while allowing for easy operation.

SUMMARY OF THE INVENTION

A main object of the present invention is to provide a transmission device used for expanding monitors, comprising the body, and a combination of at least a first monitor, a second monitor and a actuation module that can be installed thereon. The actuation module can drive the second monitor to move reciprocally on a reference axis X; and, the second monitor is provided with a drive module to drive the second monitor to move reciprocally on a reference axis Y perpendicular to the reference axis X, which jointly provide a mechanism, under which an expansion and combination of the screen of the first monitor and the screen of the second monitor (in the same planimetric position) and/or retraction are enabled.

To fulfill the foregoing object, an embodiment of the present invention is to design an transmission device used for expanding the monitors, the said actuation module comprises a motor driven spindle and an actuator that moves with the rotating spindle, the actuator is a circular device or a rotary disk structure provided with activating unit, and capable of reciprocating movement on a path unit of the body and a tractive unit of the second monitor, whereby causing the second monitor to move on the reference axis X, to enable the expansion and combination of the first monitor and the second monitor and/or their retraction in the body.

A transmission device used for expanding monitors according to the present invention, the said drive module comprises a motor-driven drive rod, a follow-up unit of the combination drive rod and a pivotally coupled follow-up unit, the reaction frame of the second monitor. And the follow-up units can move reciprocally (up and down) in response to the moving drive rod, causing the reaction frame to drive the second monitor (or its screen) to move on the reference axis Y to arrive at the position in height the same as the first monitor (or its screen), whereby enabling its combination with the first monitor.

A transmission device used for expanding monitors according to the present invention, the body is provided with a pedestal and a drive. The drive comprises a motor-driven drive rod, a follow-up unit of the combination drive rod and a pivotally coupled follow-up unit, the reaction frame of the pedestal. And the follow-up units can move reciprocally in response to the moving drive rod, causing the reaction arm to open the pedestal for supporting the body, and/or drive the pedestal to retract inside the body.

Advantages and favorable effects of the present invention lie in that the transmission device used for expanding the monitors, when compared with traditional approaches, includes the following merits and considerations while easy operation is ensured in the first place:

1. Structure of the body 90 used for combining a first monitor 10, a second monitor 20 and/or a third monitor 30 has been redesigned and reconsidered. For example, the body 90 is provided with a drive 80, reaction arm 84 and pedestal 95, enabling pedestal 95 to open for supporting the body 90 or retract in the body 90; Body 90 is provided with actuation module 40, actuator 43, main actuating rod 47 and/or auxiliary actuating rod 48, which are used to drive the second monitor 20 and/or the third monitor 30 to move between the first position and the second position with the aid of path units 51, 56 of the main board 50 and/or auxiliary board 55; The second monitor 20 and/or the third monitor 30 are provided with drive module 60, follow-up unit 63 and reaction frame 70 to drive the second monitor 20 and/or the third monitor 30 to arrive at the set (height) position and combine with the first monitor 10 and/or retract, which are apparently different from the structure form and operating mode in prior art.

2. In particular, the structure form in which actuation module 40 drives the second monitor 20 and/or the third monitor 30 enables operators to use a plurality of actuation modules 40 to drive multiple monitors.

Therefore, the present invention provides an effective transmission device for expanding monitors, the spatial form of which is different from the prior devices, and it has the advantages that are incomparable by prior art, representing a considerable progress, truly and fully meeting the essential conditions of invention patent.

Figure 1:
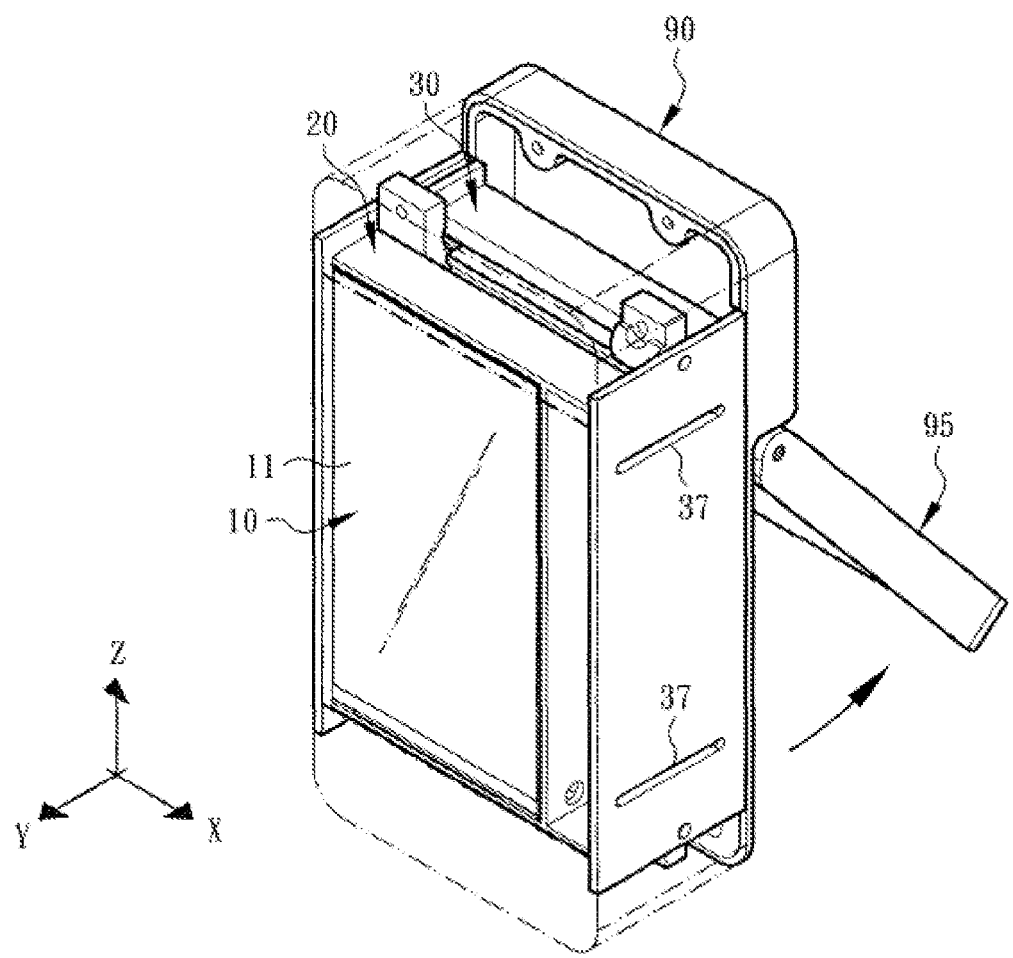
FIG. 1 is a three-dimensional schematic structure view of the present invention, which shows the structural combination of the body, the first monitor and the pedestal.

In the drawings: 10: the first monitor; 11, 21, 31: Screen; 20: the second monitor; 22, 32: screen backboard; 23, 33: pedestal; 24, 34: tractive unit; 25, 35: fixation unit; 26, 36: slot unit; 28, 38: combination unit; 29, 39: limitation unit; 29a, 39a: limitation slot; 30: the third monitor; 32a: boss; 33a: rib; 35a: extension; 37: track; 40: actuation module; 41, 61, 81: motor; 42: spindle; 43: actuator; 44: activating unit; 45: drive segment; 46: turning wheel; 47: main actuating rod; 48: auxiliary drive rod; 50: main board; 51, 56: path unit; 51a, 56a: start point; 51b, 56b: end point; 52, 57: pivotal coupling unit; 53: main rod; 55: auxiliary board; 58: auxiliary rod; 60: drive module; 62, 82: drive rod; 63, 83: follow-up unit; 65, 85: base; 66, 86: thread unit; 67, 68, 87: pivotal coupling end; 69: mouth; 70: reaction frame; 71: main arm; 71a, 72a, 84a: first end; 71b, 72b, 84b: second end; 72: auxiliary arm; 73, 74: waist; 75: spindle pin; 80: drive; 84: reaction arm; 88: lug; 90: body; 91: locating unit; 95: pedestal; 96: fixation unit; 97: coupling hole.

DETAILED DESCRIPTION OF THE PREFERRED EMBODIMENTS

The invention will now be described in more detail with reference to the accompanying drawings and embodiments. The following embodiments are merely intended for a better illustration of the present invention, rather than limiting the scope of the present invention.

Figure 2:
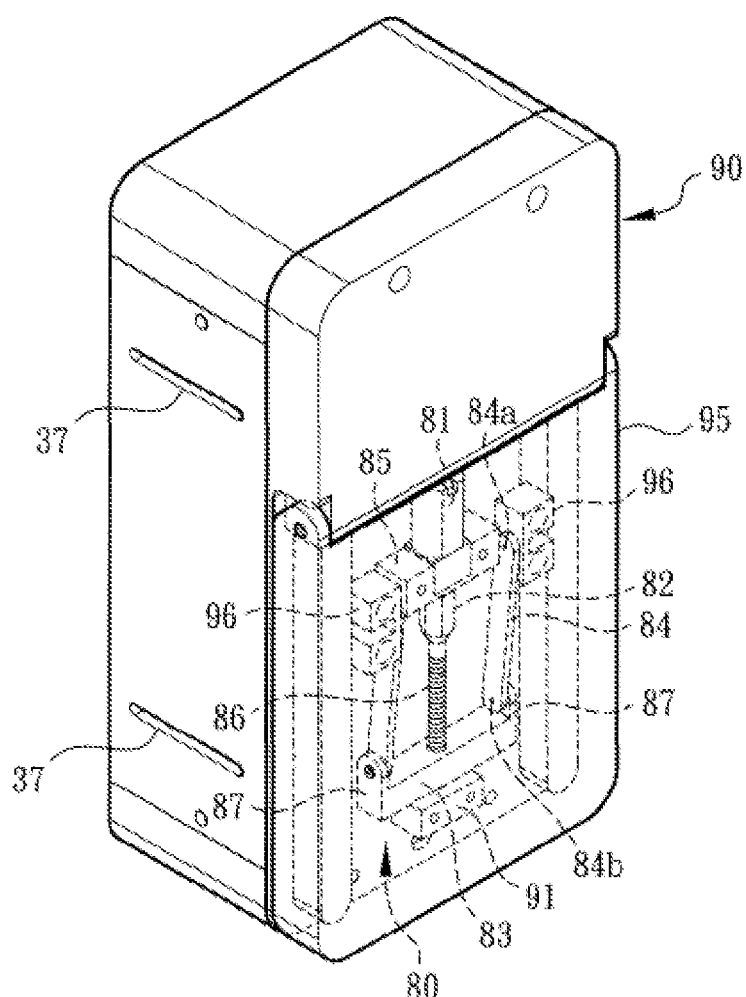
FIG. 2 is another three-dimensional schematic structure view of the present invention, which shows the structural combination of the body, the pedestal and the drive.
Figure 3:
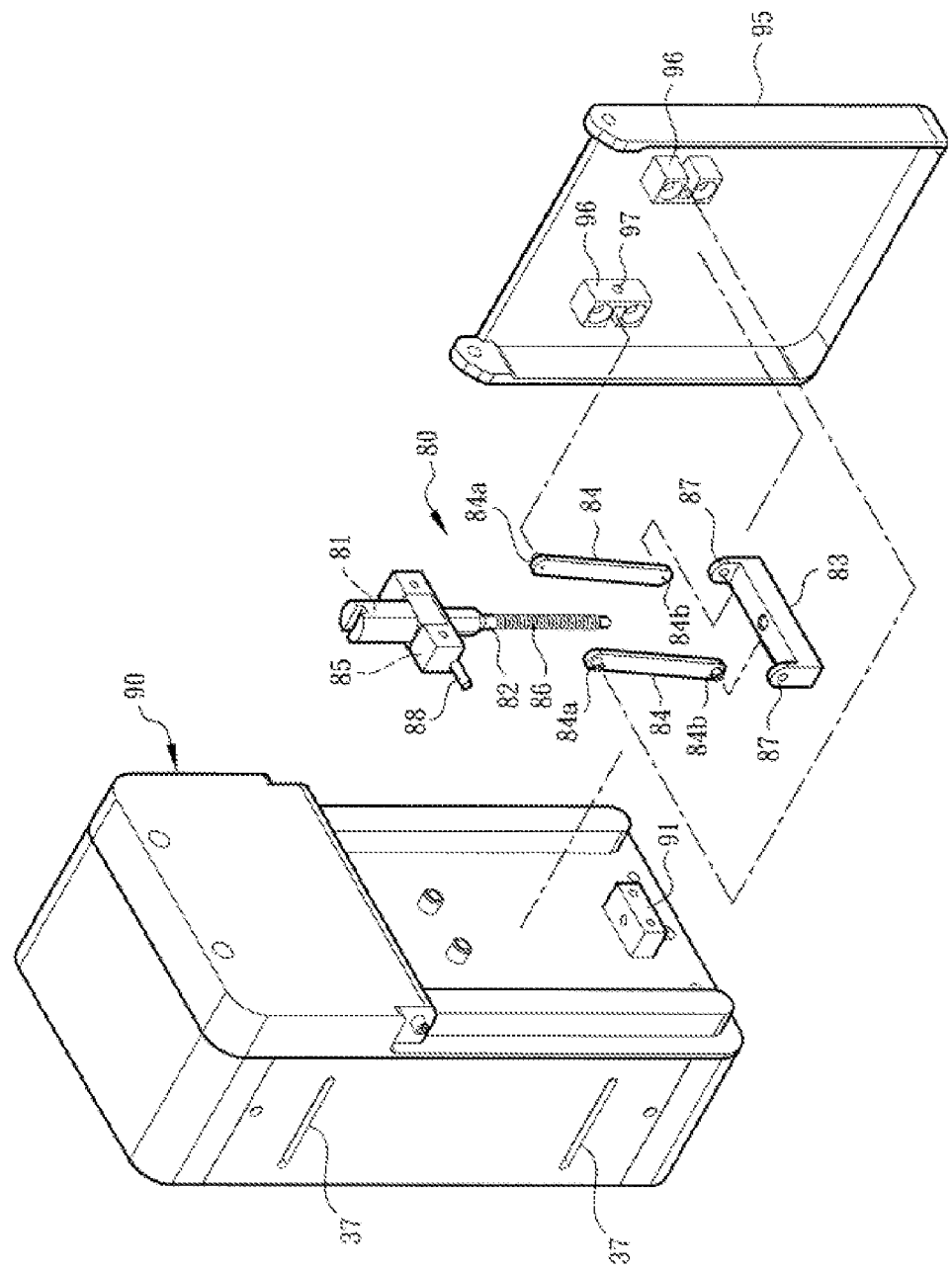
FIG. 3 is a schematic structural decomposition view of FIG. 2, which shows the structural condition of the body, the pedestal and the drive.

As shown in FIGS. 1~3, a transmission device used for expanding monitors according to the present invention comprises body 90 and a combination of at least 2 monitors (10, 20 . . . ; or called "display screens"). Body 90 is defined to have a reference axis X, a reference axis Y perpendicular to reference axis X, a reference axis Z; body 90 is of a frame and/or casing structure for assembling or holding monitors. And monitors shall at least include a first monitor 10 (and screen 11), a second monitor 20 and/or a third monitor 30, as an illustrative embodiment.

In a preferred embodiment, the body 90 is provided with a pedestal 95 and a drive 80. Pedestal 95 has one end pivotally coupled with the body 90, so that pedestal 95 can swivel freely. And drive 80 comprises a drive rod 82 driven by a motor 81, a follow-up unit 83 of the combination drive rod 82 and a pivotally coupled follow-up unit 83, a reaction arm 84 of the pedestal 95, etc.

Particularly speaking, drive 80 (or motor 81, drive rod 82), along with base 85, is assembled and fixed on body 90; drive rod 82 is provided with a thread segment 86 for pivotal coupling of the follow-up unit 83, so that the follow-up 83 adapts to the rotation of drive rod 82 and moves reciprocally (or moves) on reference axis Z. And the follow-up unit 83 is provided with at least one or two pivotal coupling ends 87 used for pivotal coupling of reaction arm 84.

The figure shows that reaction arm 84 has a first end 84a and a second end 84b; the first end 84a is used for pivotal coupling of pedestal 95 with the aid of a fixation unit 96 on pedestal 95 and coupling hole 97 in the fixation unit, and the second end 84b is used for pivotal coupling of the pivotal coupling end 87 of the follow-up unit 83.

Figure 4:
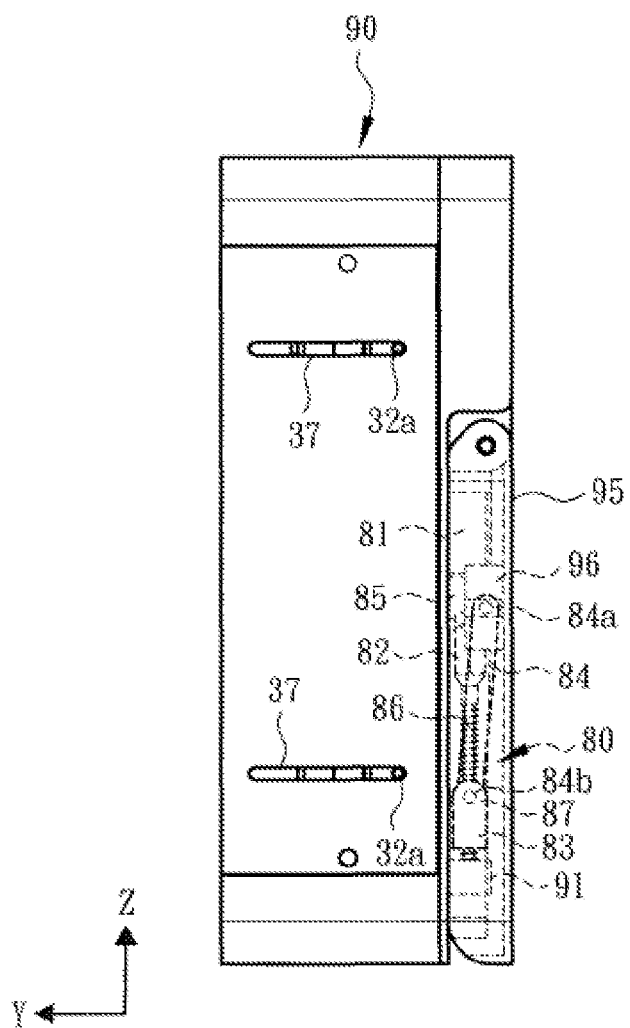
FIG. 4 is a schematic planar structure view of FIG. 2.
Figure 5:
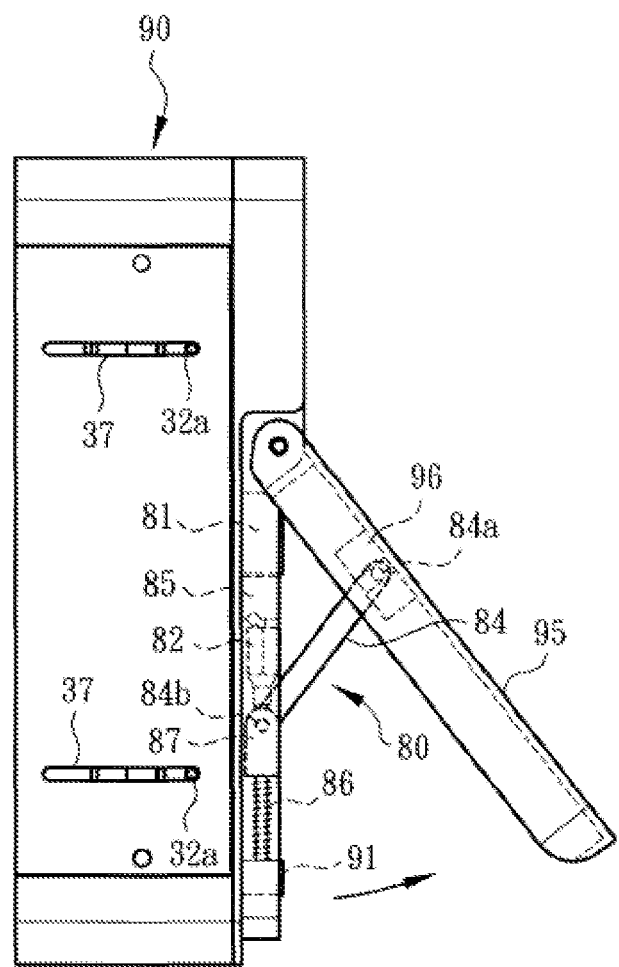
FIG. 5 is a schematic view of an operation embodiment of FIG. 4, which shows the condition for the drive to move or push open the pedestal.

As shown in FIGS. 4 and 5, these drawings illustrate the movement of follow-up unit 83 on reference axis Z when motor 81 drives the drive rod 82 and thread segment 86 to rotate, which controls the pedestal 95 to open or to retract in the body 90.

When follow-up unit 83 moves towards the top of the drawing, it presses the first end 84a of the reaction arm 84 to move away from body 90 (or along reference axis Y), and push against pedestal 95 to form a support for the body 90; for example, the circumstance shown in FIG. 5. And/or when follow-up unit 83 moves towards the bottom of the drawing, it causes reaction arm 84 to pull at the pedestal 95 and make it to retract in the body 90; For example, the circumstance shown in FIG. 4.

In a viable embodiment, base 85 of drive 80 (or body 90) is provided with a lug 88, used for assisting the follow-up unit 83 to press the reaction arm 84, ensuring the reaction arm 84 moves towards pedestal 95. And body 90 is provided with a locating unit 91, which can be used to assist in the fixation of the drive rod 82 of drive 80 and limitation of the moving range of the follow-up unit 83 of the drive.

Figure 6:
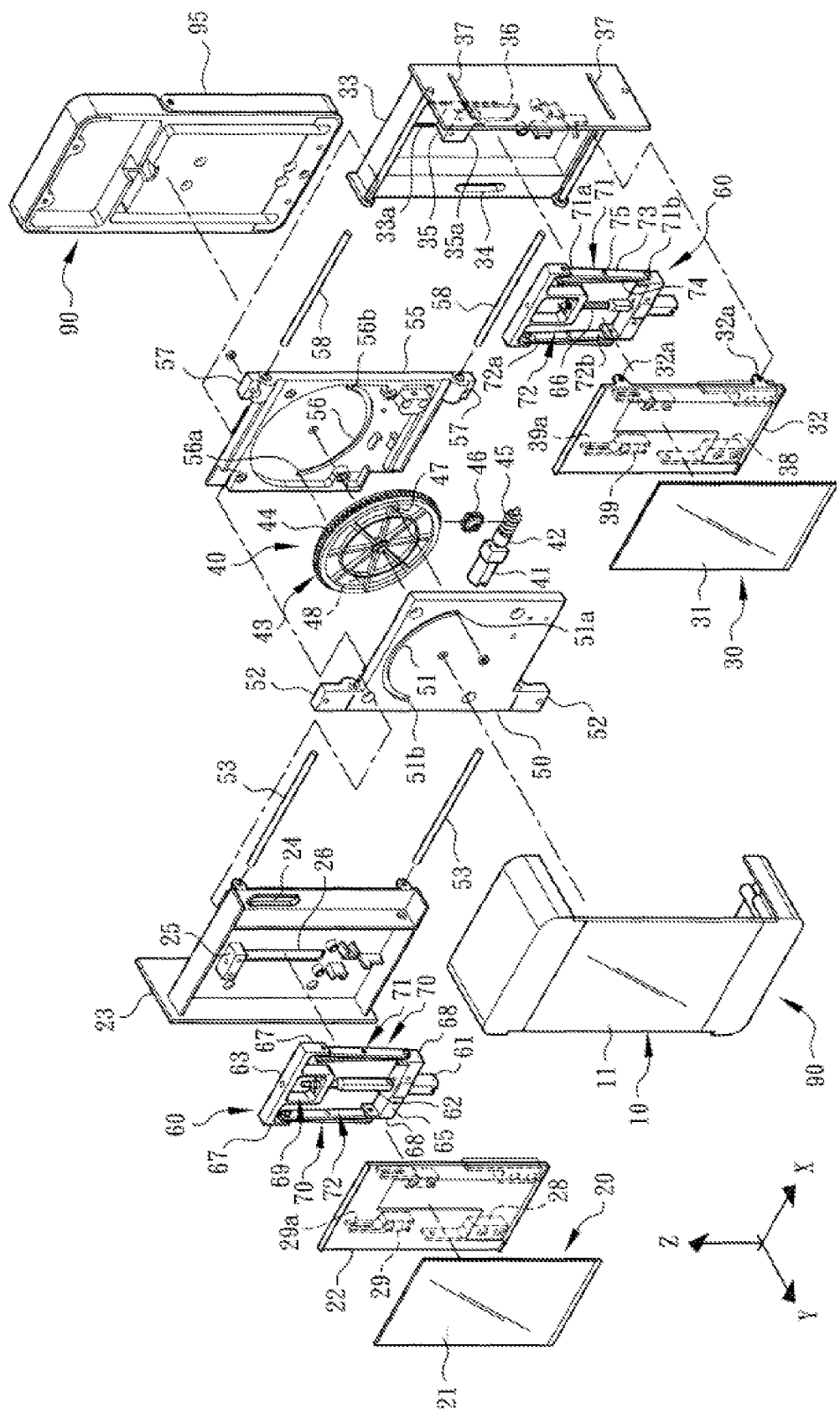
FIG. 6 is a schematic view of structure decomposition according to the present invention, which shows the structure of the body, the first monitor, the actuation module, the second monitor, the drive module, the third monitor and the auxiliary drive module.

As shown in FIG. 6, body 90 is provided with an actuation module 40. The said actuation module 40 comprises a spindle 42 driven by a motor 41 and an actuator 43 that moves as spindle 42 rotates; Actuator 43 is a circular device or a rotary disk structure, provided with an activating unit 44 of teethed structure.

Specifically speaking, spindle 42 has a drive segment 45 of worm structure for assisting a turning wheel to engage with the activating unit 44 of actuator 43; thus, when spindle 42 is rotating, it will (via turning wheel 46) drive the actuator 43 to rotate synchronously. And actuator 43 is provided with at least one actuating rod.

In a preferred embodiment, corresponding to a second monitor 20 and a third monitor 30, the actuating rod comprises a main actuating rod 47 and an auxiliary actuating rod 48, which are located roughly in opposite positions across actuator 43. And body 90 is provided with a main board 50 and/or an auxiliary board 55; main board 50 and auxiliary board 55 are designed to have curved path units 51, 56 of semi-circular track structure, respectively used for holding main actuating rod 47 and auxiliary actuating rod 48.

The drawing shows the path unit 51 of main board 50 haunches up towards the top of the drawing to form a circular arch in the shape of (⌒) and the path unit 56 of auxiliary board 55 haunches down towards the bottom of the drawing to form an inverted arch in the shape of (⌣). And main actuating rod 47 is located at start point 51a of the main board path unit 51, and auxiliary actuating rod 48 at start point 56a of auxiliary board path unit 56, respectively defined as the first position, and main actuating rod 47 is located at the end point 51a of the main board path unit 51, and auxiliary actuating rod 47 at the end point 56b of the auxiliary board path unit 56, respectively defined as the second position.

FIG. 6 also shows main board 50 and auxiliary board 55 are provided with pivotal coupling units 52, 57 respectively corresponding to main rod 53 and auxiliary rod 58, used for pivotal coupling of the second monitor 20 and the third monitor 30.

In a preferred embodiment, the second monitor 20 and the third monitor 30 comprise screens 21, 31, screen backboards 22, 32, bases 23, 33 and tractive units 24, 34 of slotted structure on bases 23, 33. The second monitor base 23 is connected with the pivotal coupling unit 52 of the main board via main rod 53, the third monitor base 33 is connected with the pivotal coupling unit 57 of the auxiliary board via auxiliary rod 58, enabling the second monitor 20 and the third monitor 30 to freely move reciprocally on reference axis X. And main actuating rod 47 is pivotally coupled with (or located in) tractive unit 24 of the second monitor 20, auxiliary actuating rod 48 is pivotally coupled with (or located in) tractive unit 34 of the third monitor 30, enabling the second monitor 20 and the third monitor 30 to reciprocally move on reference axis X, for expanding and combining the first monitor 10 and/or retraction in body 90.

Figure 7:
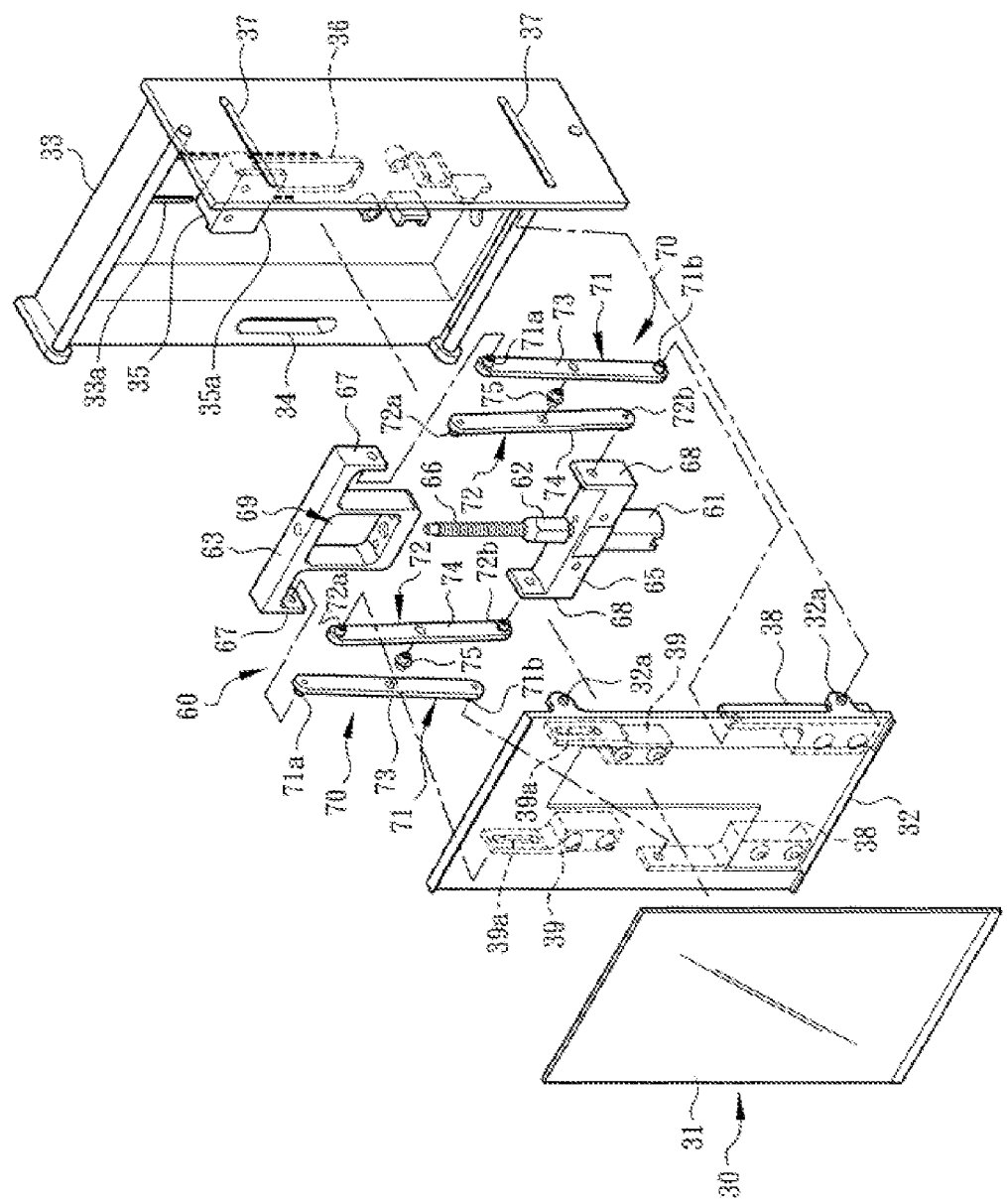
FIG. 7 is a schematic structure decomposition view of the third monitor and the auxiliary drive module according to the present invention.

As shown in FIGS. 6 and 7, the second monitor 20 and the third monitor 30 are respectively provided with a drive module 60. Drive module 60 comprises a drive rod 62 driven by motor 61, a follow-up unit 63 of the combination drive rod 62, base 65 and a pivotally coupled follow-up unit 63, reaction frame 70 of the second monitor 20 (screen backboard 22) or the third monitor 30 (screen backboard 32).

Particularly speaking, bases 23, 33 of the second monitor 20 and the third monitor 30 are provided with fixation units 25, 35 and slotted units 26, 36; screen backboards 22, 32 of the second monitor 20 and the third monitor 30 are respectively provided with combination unit 28, 38, limitation units 29, 39 as well as limitation slots 29a, 39a provided on limitation units 29, 39. And base 33 of the third monitor 30 (or the second monitor 20) is provided with a protruding structure rib 33a, used for reducing the frictional force or resistance of the follow-up unit 63 of the drive module during moving.

In a preferred embodiment, drive module 60 (or motor 61, drive rod 62), along with base 65, and the fixation unit 25 of the second monitor 20, the fixation unit 35 of the third monitor 30, is assembled and fixed on pedestals 23, 33; drive rod 62 is provided with thread segment 66, pivotal coupling follow-up unit 63 to adapt follow-up unit 63 to the rotation of drive rod 62, and move reciprocally (or move) on reference axis Z. And the fixation unit 35 of the third monitor 30 is also connected with an extension 35a, used for holding the follow-up unit 63 of drive module 60 stable while it is moving on reference axis Z.

FIGS. 6 and 7 also shows that base 33 of the third monitor is provided with track 37 for holding or retaining the boss 32a provided on screen backboard 32 in a corresponding manner, for the purpose of assisting in the regulation of the drive stability of screen backboard 32.

In a viable embodiment, the follow-up unit 63 of the drive module 60 has a mouth 69 used for holding the fixation unit 25 of the second monitor (or the fixation unit 35 of the third monitor); therefore, dimensions or height of mouth 69 adapt to the fixation unit 25 of the second monitor (or the fixation unit 35 of the third monitor), and can determine the moving distance of the follow-up unit 63 along with fixation unit 25 of the second monitor (or fixation unit 35 of the third monitor). And the follow-up unit 63 of the drive module 60 and base 65 are respectively provided with at least one or two pivotal coupling ends 67, 68, used for pivotal coupling of the reaction frame 70.

The drawings show that the reaction frame 70 of the drive module 60 comprises a main arm 71 and an auxiliary arm 72; main arm 71 and auxiliary arm 72 respectively have a first end 71a, 72a, a second end 71b, 72b, as well as a waist 73, 74 connected between the first end 71a, 72a and the second end 71b, 72b.

In a preferred embodiment, the first end 71a of the main arm is pivotally coupled with the pivotal coupling end 67 of the follow-up unit of the drive module, the second end 71b of the main arm is pivotally coupled with the combination unit 28 of the second monitor (or the combination unit 38 of the third monitor); the first end 72a of the auxiliary arm is pivotally coupled with the limitation slot 29a of the limitation unit 29 of the second monitor (or the limitation slot 39a of the limitation unit 39 of the third monitor, and the second end 72b of the auxiliary arm is pivotally coupled with the pivotal coupling end 68 of the base 65 of the drive module.

And, the waist 73 of the main arm 71 and the waist 74 of the auxiliary arm 72 form a spindle fulcrum along with spindle pin 75, causing main arm 71 and auxiliary arm 72 to form a cross or X structure. Therefore, the follow-up unit 63 of drive module 60 can move reciprocally along reference axis Z (up and down) along with the moving drive rod 62, enabling reaction frame 70 to drive the second monitor 20 (screen 21) or the third monitor 30 (screen 31) to move on reference axis Y and arrive at a height or position the same as the first monitor 10 (or its screen 11), whereby a combination with the first monitor 10 is realized.

Figure 8:
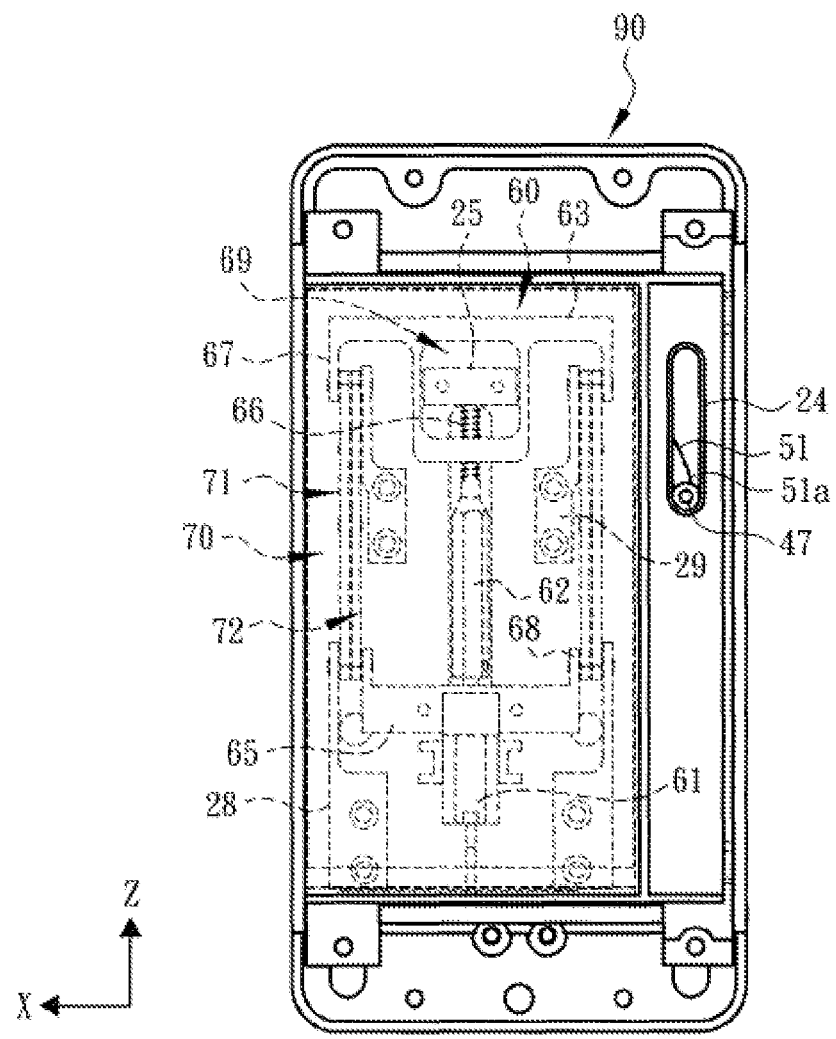
FIG. 8 is a schematic planar combination structure according to the present invention, which shows the condition for the first monitor, the second monitor and/or the third monitor in the retracted position or the first position.

As shown in FIG. 8, it shows the first monitor 10, the second monitor 20 and the third monitor 30 are combined or held in the body 90. At this point of time, main actuating rod 47 is at the start point 51a of the path unit 51 of the main board, and/or the auxiliary actuating rod 48 is at the start point 56a of the path unit 56 of the auxiliary board, or called "the first position".

Figure 9:
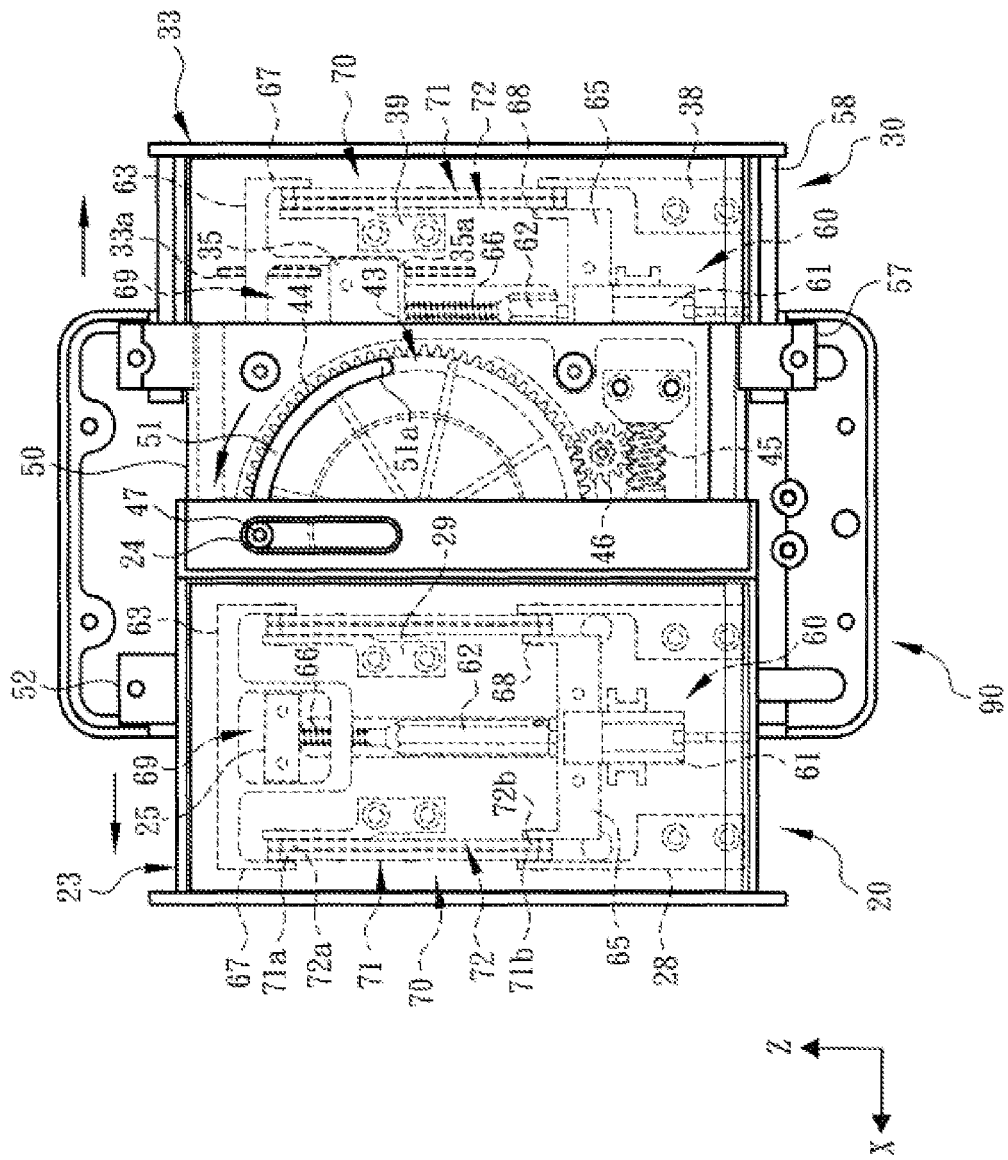
FIG. 9 is a schematic planar structure view of an operation embodiment of the present invention, which shows the movement of the first monitor and the second monitor along the reference axis X as driven by the actuation module.

As shown in FIG. 9, it shows the spindle drive segment 45 of the actuation module 40 drives the activating unit 44 of the turning wheel 46 and actuator 43, causing the actuator 43 to rotate synchronously and drive the main actuating rod 47 to move towards the end point 51b along the path unit 51 of the main board and/or drive the auxiliary actuating unit 48 to move towards end point 56b or the second position, along the path unit 56 of the auxiliary board, and also drive the second monitor 20 and the third monitor 30 to move on reference axis X (expand away from body 90).

The drawing also shows the position change of the main actuating rod 47 for adapting to the path unit 51 of the main board, where it moves from the bottom end of the tractive unit 24 of the second monitor shown in FIG. 8 to the top end position of tractive unit 24 shown in FIG. 9. Also can be known is the position change of the auxiliary actuating rod 48 for adapting to the path unit 56 of the auxiliary board, where it moves from the top end of the tractive unit 34 of the third monitor to the bottom end position of the tractive unit 34.

Figure 10:
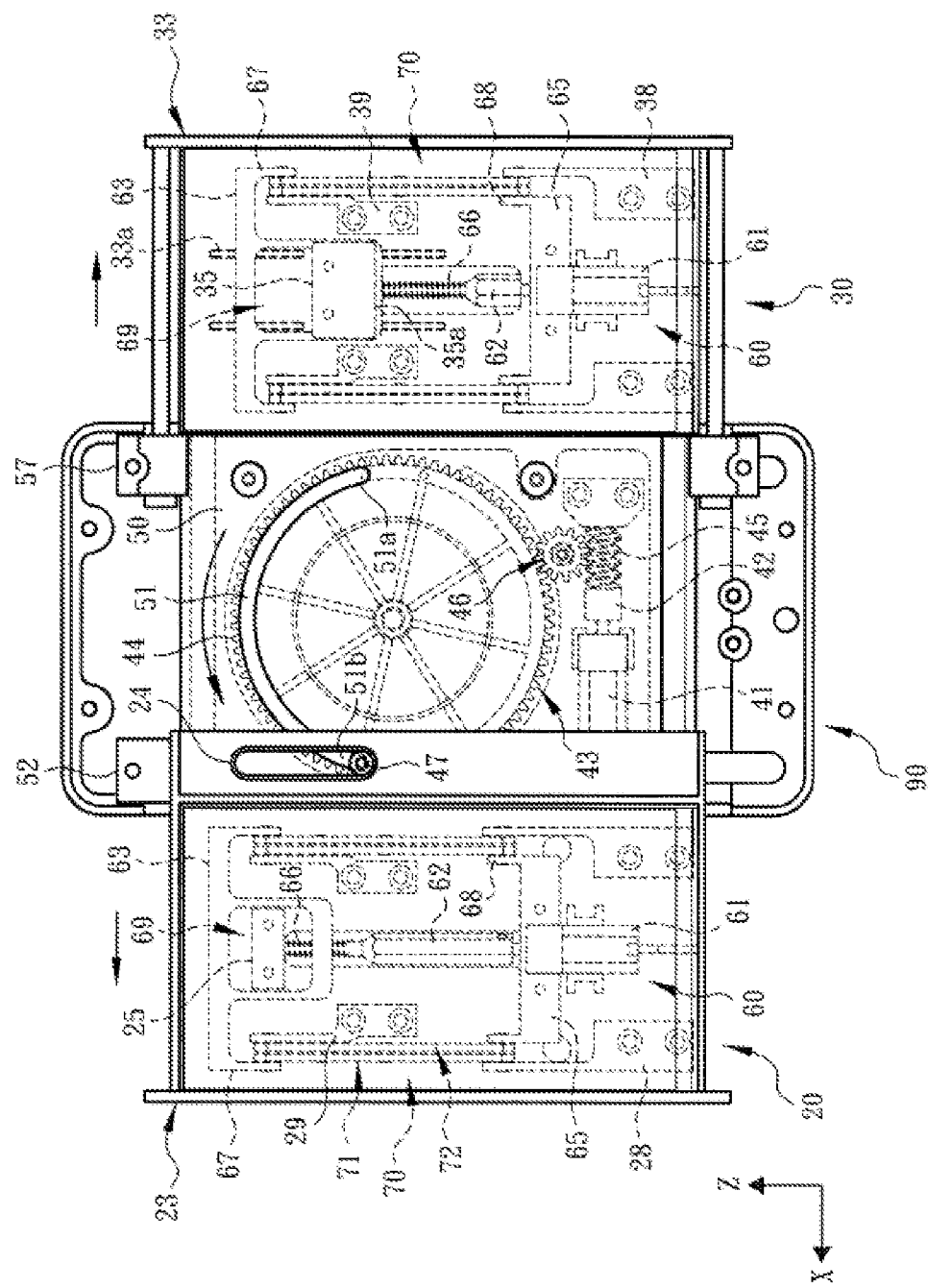
FIG. 10 is another schematic planar structure view of an operation embodiment of the present invention, which shows the movement of the first monitor and the second monitor along the reference axis X and their arrival at the second position as driven by the actuation module.
Figure 11:
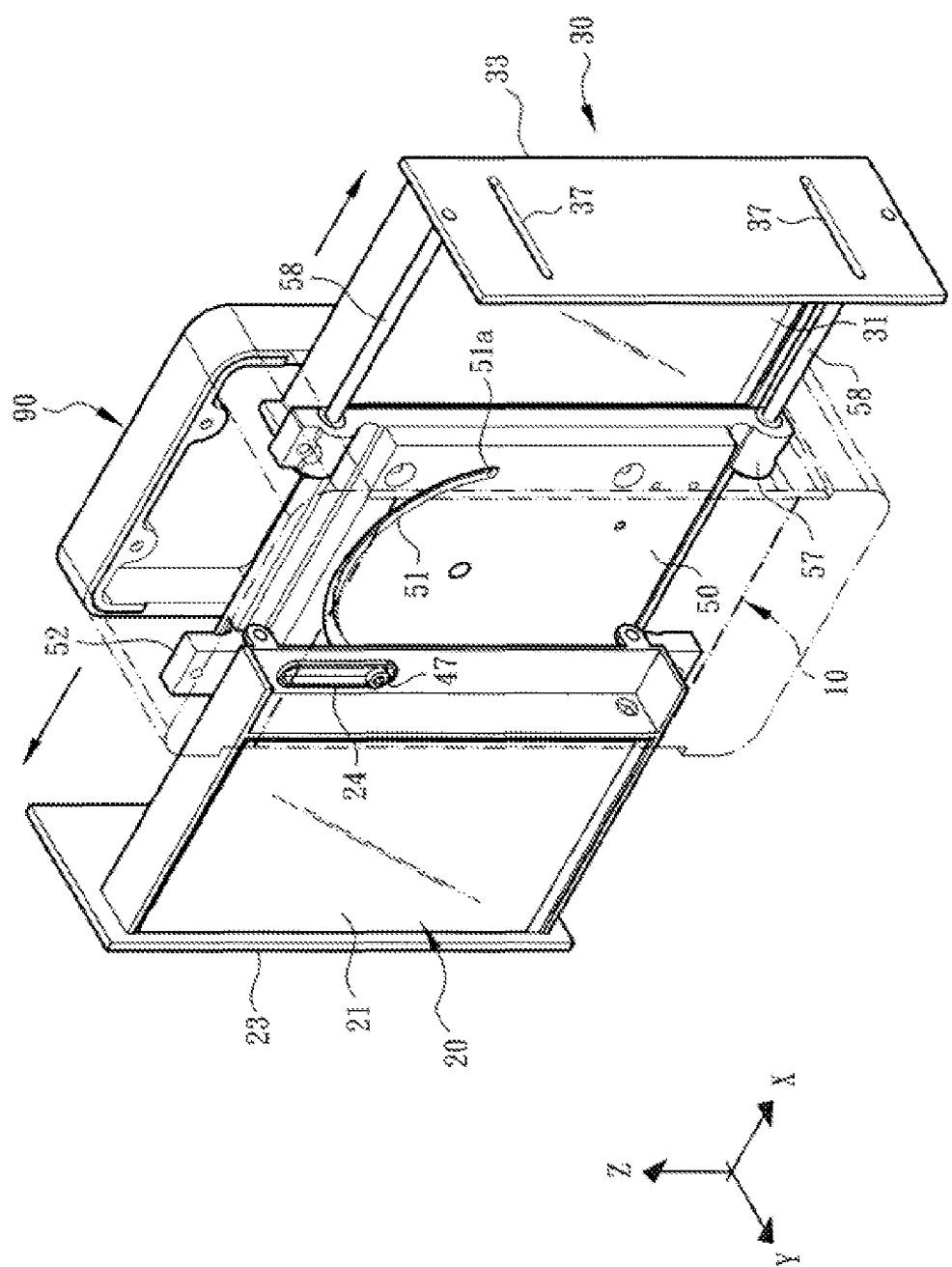
FIG. 11 is a three-dimensional schematic structure view of FIG. 7.

As shown in FIGS. 10 and 11, when actuator 43 drives the main actuating rod 47 to arrive at the end point 51b of the path unit 51 of the main board (and/or drives the auxiliary actuating rod 48 to arrive at the end point 56b of the path unit 56 of the auxiliary board) or the second position, and causes the second monitor 20 (and/or the third monitor 30) to be fully expanded, the main actuating rod 47 again moves from the top end position of the tractive unit 24 of the second monitor to the bottom end position of the tractive unit 24 (and/or the auxiliary actuating rod 48 moves from the bottom end position of the tractive unit 34 of the third monitor to the top end position of the tractive unit 34).

Figure 12:
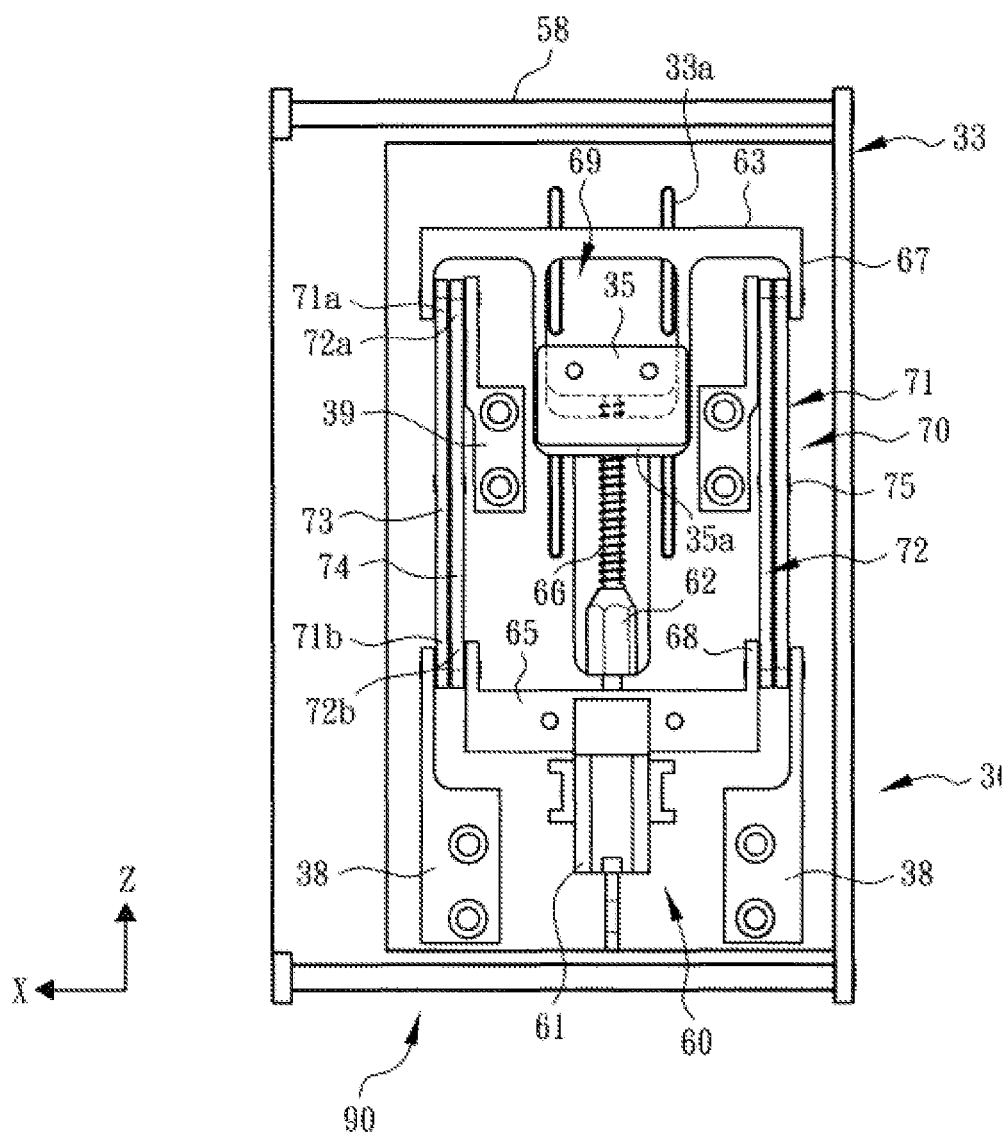
FIG. 12 is a schematic planar structure view according to the present invention, which shows the structural combination of the second monitor and the drive module.
Figure 13:
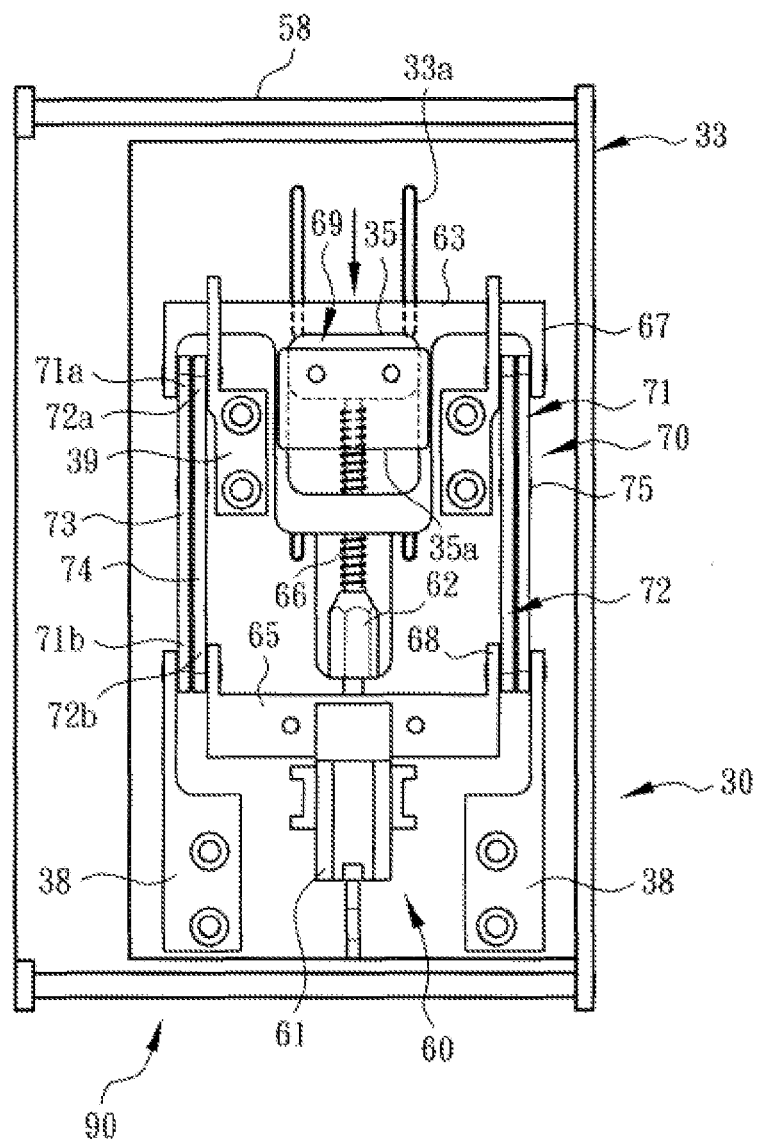
FIG. 13 a schematic planar structure view of an operation embodiment shown in FIG. 12, which shows the movement of the follow-up unit towards the bottom of the drawing (or reference axis Z) as driven by the drive rod of the drive module.

FIGS. 12 and 13 show the coordination between the third monitor 30 and the drive module 60. When the drive rod 62 (or thread segment 66) of the drive module 60 drives the follow-up unit 63 to move along the reference axis Z towards the bottom of the drawings, it causes the pivotal coupling end 67 of the follow-up unit to down press the main arm 71 (or the first end 71a of the main arm), and the main arm 71, with the spindle pin 75 of its waist 73 as the fulcrum, causes the second end 71b of the main arm to push or push open, along the reference axis Y, the combination unit 38 of the screen backboard and screen 31 of the third monitor 30 (or the second monitor 20) (or the combination unit 28 of the screen backboard and screen 21); For example, the circumstance shown in FIGS. 14 and 15.

Furthermore, when the follow-up unit 63 moves along the reference axis Z towards the bottom of the drawings, the follow-up unit 63, along with base 65, presses the auxiliary arm 72 (or the second end 72b of the auxiliary arm), and the auxiliary arm 72, with spindle pin 75 of its waist 74 as the fulcrum, allows the first end 72a of the auxiliary arm to move inside the limitation slot 39a of the third monitor (or the limitation slot 29a of the second monitor), and push and push open, along the reference axis Y, the backboard limitation unit 39 and screen 31 of the third monitor 30 (or the backboard limitation unit 29 and screen 21 of the second monitor), jointly causing the third monitor 30 (or the second monitor 20) to arrive at the set (height) position and merge or combine with the first monitor 10; For example, the circumstance shown in FIGS. 14 and 15.

Figure 14:
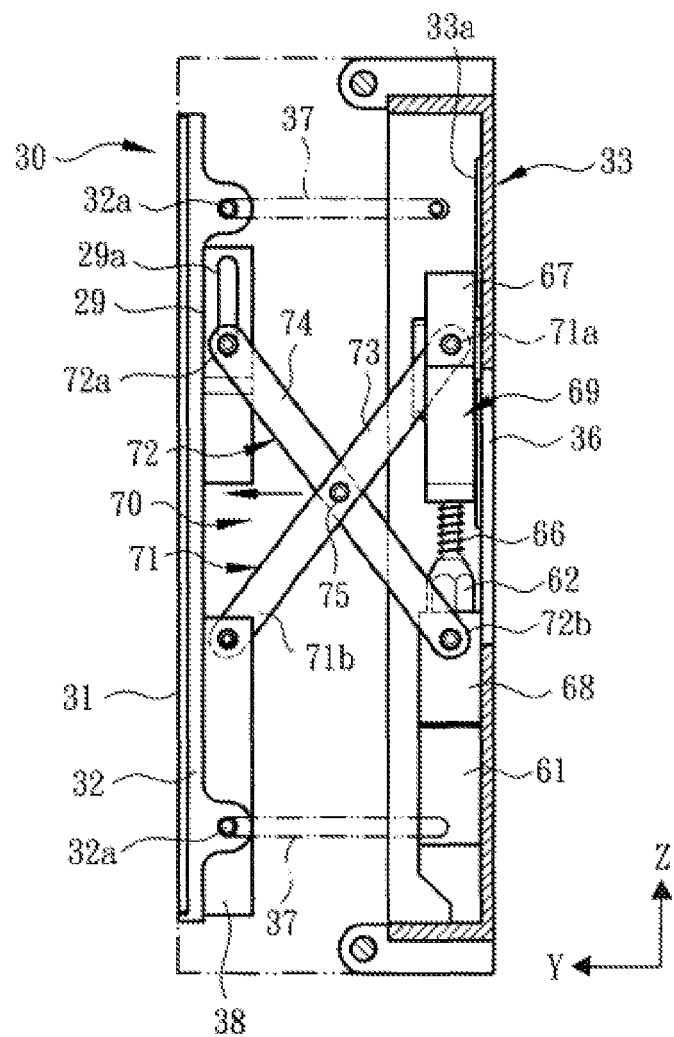
FIG. 14 is a schematic planar structure view of FIG. 13, which shows the movement of the follow-up unit towards the bottom of the drawing (or reference axis Z) as driven by the drive rod of the drive module, causing the reaction frame to push the third monitor to move towards the reference axis Y.
Figure 15:
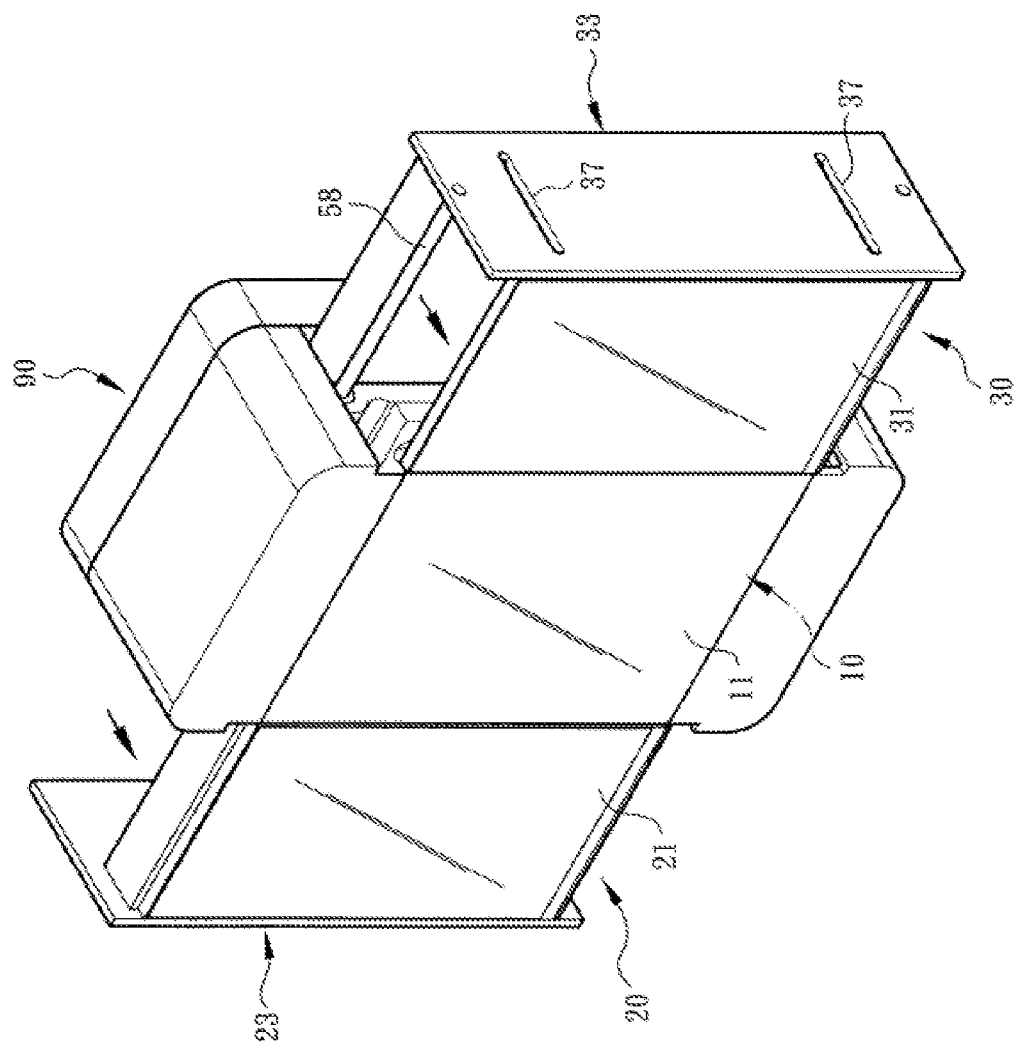
FIG. 15 is a three-dimensional schematic structure view of an operation embodiment of the present invention, which shows the expansion and combination of the second monitor and the third monitor or combination with the first monitor.

FIG. 14 also shows that when the third monitor 30 is moving along the reference axis Y, its boss 32a moves along the track 37 of the third monitor base 33. And when the third monitor 30 (or the second monitor 20) arrives at the set position or at the same level as the first monitor 10 (or in the same position as the first monitor 10), the reaction frame 70 is in the cross open position to form a configuration similar to (X).

It can be known that when the drive module 60 drives the third monitor 30 (or the second monitor 20) is moving in a direction opposite the foregoing movement, it causes the third monitor 30 (or the second monitor 20) to return to the positions shown in FIGS. 10, 11 and 12. And the third monitor 30 (or the second monitor 20) is driven by the actuation module 40 to move from the second position to the first position shown in FIG. 8.

The above are merely viable embodiments of the present invention, rather than limiting the scope of the present invention. In other words, any change and/or variation made within the scope of the application scope of the present invention are covered by the scope of the present invention.

The invention claimed is:

1. A transmission device used for expanding monitors, comprising:
   a body,
   a combination of a plurality of monitors and the actuation module that can be installed thereon; wherein the body is defined with a reference axis X, a reference axis Y perpendicular to the reference axis X and a reference axis Z; the plurality of monitors at least include a first monitor and a second monitor, and the first monitor has a display screen; the actuation module comprises a spindle, an actuator that moves along with the rotating spindle, causing the actuator to drive the second monitor to move reciprocally on the reference axis X; and the second monitor is provided with screen, a base and a drive module assembled on the base; the drive module has a base, a drive rod pivotally coupled on the base, a follow-up unit driven by the drive rod, which cause the second monitor to move reciprocally on the reference axis Y, jointly providing an expansion and combination and retraction mechanism for the screen of the first monitor and the screen of the second monitor.

2. The transmission device used for expanding monitors as described in claim 1, wherein, the body is of a frame or casing structure; the body is provided with a pedestal and a drive; the pedestal has one end that is pivotally coupled with the body, enabling the pedestal to swivel freely; and the drive comprises a motor-driven drive rod, a follow-up unit of the combination drive rod and a pivotally coupled follow-up unit, as well as a reaction arm of the pedestal.

3. The transmission device used for expanding monitors as described in claim 2, wherein, the drive, along with a base, is assembled and fixed on the body; the body is provided with a thread segment and a pivotally coupled follow-up unit, causing the follow-up unit to move reciprocally on the reference axis Z in response to the rotation of the drive rod; the follow-up unit is provided with at least one pivotal coupling end for pivotal coupling of the reaction arm; and the reaction arm has a first end and a second end; the first end of the reaction arm is used for pivotal coupling of the pedestal with the aid of the fixation unit on the pedestal and the coupling hole in the fixation unit, and the second end is the pivotal coupling end for pivotal coupling of the follow-up unit of the drive.

4. The transmission device used for expanding monitors as described in claim 3, wherein, either the base of the drive or the body is provided with a lug; and the body is provided with a locating unit used for fixing the drive rod of the drive and limiting the moving range of the follow-up unit of the drive.

5. The transmission device used for expanding monitors as described in claim 1, wherein, the actuator of the actuation module is either a circular device or a rotary disk structure, and is provided with an activation unit; the spindle has a drive segment; the actuator is provided with at least an actuating rod, making the actuating rod to move in a path unit and further drive the second monitor to move; the path unit is of a circular structure, and is provided on a main board of the body; and the second monitor is provided with a screen backboard, and the drive module of the second monitor has a reaction frame that moves in response to the movement of the follow-up unit of the drive module.

6. The transmission device used for expanding monitors as described in claim 5, wherein, the activating unit of the actuator has a teethed structure; the drive segment of the spindle has a worm structure, which engages with the activating unit of the actuator via a turning wheel.

7. The transmission device used for expanding monitors as described in claim 5, wherein, the said monitor also includes a third monitor, and the third monitor is also provided with a screen, base and a drive module assembled on the base, which causes the third monitor to move reciprocally on the reference axis Y; the third monitor is also provided with a screen backboard, and the drive module of the third monitor also has a reaction frame that moves in response to the movement of the follow-up unit of the drive module; the actuating rod includes a main actuating rod and auxiliary actuating rod located in two opposite positions across the actuator; and the body also includes an auxiliary board, the auxiliary board is also provided with a path unit; the main board path unit and the auxiliary board path unit form a semi-circular track structure, respectively for holding the main actuating rod and the auxiliary actuating rod; furthermore, the main actuating rod is located at the start point of the main board path unit and the auxiliary actuating rod, at the start point of the auxiliary board path unit, respectively for defining first position, while the main actuating rod is located at the end point of the main board path unit and auxiliary actuating rod, at the end of the auxiliary board path unit, respectively for defining the second position.

8. The transmission device used for expanding monitors as described in claim 6, wherein, the said monitor also includes a third monitor, and the third monitor is also provided with a screen, base and a drive module assembled on the base, which causes the third monitor to move reciprocally on the reference axis Y; the third monitor is also provided with a screen backboard, and the drive module of the third monitor also has a reaction frame that moves in response to the movement of the follow-up unit of the drive module; the actuating rod includes a main actuating rod and auxiliary actuating rod located in two opposite positions across the actuator; and the body also includes an auxiliary board, the auxiliary board is also provided with a path unit; the main board path unit and the auxiliary board path unit form a semi-circular track structure, respectively for holding the main actuating rod and the auxiliary actuating rod; furthermore, the main actuating rod is located at the start point of the main board path unit and the auxiliary actuating rod, at the start point of the auxiliary board path unit, respectively for defining first position, while the main actuating rod is located at the end point of the main board path unit and auxiliary actuating rod, at the end of the auxiliary board path unit, respectively for defining the second position.

9. The transmission device used for expanding monitors as described in claim 7, wherein, the path unit of main board haunches upwards to form a circular arch in the shape of $(\frown)$ and the path unit of auxiliary board haunches downwards to form an inverted arch in the shape of $(\smile)$; the main board and the auxiliary board are provided with pivotal coupling unit, base of the second monitor is connected with the pivotal coupling unit of the main board via a man rod, and base of the third monitor is connected with the pivotal coupling unit of the auxiliary board via an auxiliary rod.

10. The transmission device used for expanding monitors as described in claim 8, wherein, the path unit of the said main board haunches upward to form a circular arch in the shape of $(\frown)$ and the path unit of the auxiliary board haunches downwards to form an inverted arch in the shape of $(\smile)$; the main board and the auxiliary board are provided with pivotal coupling unit, base of the second monitor is connected with the pivotal coupling unit of the main board via a man rod, and base of the third monitor is connected with the pivotal coupling unit of the auxiliary board via an auxiliary rod.

11. The transmission device used for expanding monitors as described in claim 7, wherein, the base of the second monitor and base of the third monitor are respectively provided with tractive units of slotted structure, respectively used for holding the main actuating rod and the auxiliary actuating rod.

12. The transmission device used for expanding monitors as described in claim 8, wherein, the base of the said second monitor and base of the said third monitor are respectively provided with tractive units of slotted structure, respectively used for holding the main actuating rod and the auxiliary actuating rod.

13. The transmission device used for expanding monitors as described in claim 9, wherein, the base of the said second monitor and the base of the said third monitor are provided with tractive unit of slotted structure, respectively used for holding the main actuating rod and the auxiliary actuating rod.

14. The transmission device used for expanding monitors as described in claim 10, wherein, the base of the said second monitor and the base of the said third monitor are provided with tractive unit of slotted structure, respectively used for holding the main actuating rod and the auxiliary actuating rod.

15. The transmission device used for expanding monitors as described in claim 5, wherein, the base of the said second monitor is provided with a fixation unit and a slotted unit, screen backboard of the second monitor is provided with combination unit, limitation unit and limitation slot formed on the limitation unit; the drive module is assembled and fixed on the base of the second monitor with the aid of the base and the fixation unit of the second monitor; drive rod of the drive module is provided with thread segment used for pivotal coupling of the follow-up unit of the drive module, making the follow-up unit of the drive module to move reciprocally on the reference axis Z in response to the rotation of the drive rod; the follow-up unit of the drive module has a mouth used for holding the fixation unit of the second monitor; follow-up unit and base of the drive module are respectively provided with at least one pivotal coupling end used for pivotal coupling of the reaction frame; the reaction frame comprises a main arm and an auxiliary arm; the main arm and the auxiliary arm respectively have a first end, a second end and a waist connected between the first end and the second end; the first end of the main arm is pivotally coupled with the pivotal coupling end of the follow-up unit of the drive module, the second end of the main arm is pivotally coupled with the pivotal coupling end of the combination unit of the second monitor; the first end of the auxiliary arm is pivotally coupled with the limitation slot of the limitation unit of the second monitor, and the second end of the auxiliary arm is pivotally coupled with the pivotal coupling end of the base of the drive module; and waist of the main arm and waist of the auxiliary arm are pivotally coupled via the spindle pin to form a fulcrum for the spindle, enabling the reaction frame to drive the second monitor to move on the reference axis Y.

16. The transmission device used for expanding monitors as described in claim 6, wherein, the base of the said second monitor is provided with a fixation unit and a slotted unit, screen backboard of the second monitor is provided with combination unit, limitation unit and limitation slot formed on the limitation unit; the drive module is assembled and fixed on the base of the second monitor with the aid of the base and the fixation unit of the second monitor; drive rod of the drive module is provided with thread segment used for pivotal coupling of the follow-up unit of the drive module, making the follow-up unit of the drive module to move reciprocally on the reference axis Z in response to the rotation of the drive rod; the follow-up unit of the drive module has a mouth used for holding the fixation unit of the second monitor; follow-up unit and base of the drive module are respectively provided with at least one pivotal coupling end used for pivotal coupling of the reaction frame; the reaction frame comprises a main arm and an auxiliary arm; the main arm and the auxiliary arm respectively have a first end, a second end and a waist connected between the first end and the second end; the first end of the main arm is pivotally coupled with the pivotal coupling end of the follow-up unit of the drive module, the second end of the main arm is pivotally coupled with the pivotal coupling end of the combination unit of the second monitor; the first end of the auxiliary arm is pivotally coupled with the limitation slot of the limitation unit of the second monitor, and the second end of the auxiliary arm is pivotally coupled with the pivotal coupling end of the base of the drive module; and waist of the main arm and waist of the auxiliary arm are pivotally coupled via the spindle pin to form a fulcrum for the spindle, enabling the reaction frame to drive the second monitor to move on the reference axis Y.

17. The transmission device used for expanding monitors as described in claim 7, wherein, the bases of the said second monitor and third monitor are provided with fixation units and slot units; screen backboards of the second monitor and third monitor are provided with combination units, limitation units and limitation slots formed on the limitation unit; the drive module is fixed on the pedestal via its base, the fixation unit of the second monitor and the fixation unit of the third monitor; drive rod of the drive module is provided with thread segment used for pivotal coupling of the follow-up unit of the drive module, making the follow-up unit of the drive module to move reciprocally on the reference axis Z in response to the rotation of the drive rod; fixation unit of the third monitor is also connected to form an extension; pedestal of the third monitor is provided with a track used for holding a lug provided on the screen backboard of the third monitor; pedestal of the third monitor is provided with a rib of protruding structure; the follow-up unit of the drive module has mouths respectively used for holding the fixation unit of the second monitor and the fixation unit of the third monitor; follow-up unit and base of the drive module of the third monitor are respectively provided with at least one pivotal coupling end used for pivotal coupling of the reaction frame; the reaction frame comprises a main arm and an auxiliary arm; the main arm and the auxiliary arm respectively have a first end, a second end and a waist connected between the first end and the second end; the first end of the main arm is pivotally coupled with the pivotal coupling end of the follow-up unit of the drive module, the second end of the main arm is pivotally coupled with the pivotal coupling end of the combination unit of the second monitor and the combination unit of the third monitor; the first end of the auxiliary arm is pivotally coupled with the limitation slot of the limitation unit of the second monitor and the limitation slot of the limitation unit of the third monitor, and the second end of the auxiliary arm is pivotally coupled with the pivotal coupling end of the base of the drive module; and waist of the main arm and waist of the auxiliary arm are pivotally coupled via the spindle pin to form a fulcrum for the spindle, enabling the reaction frame to drive the second monitor and the third monitor to move on the reference axis Y.

18. The transmission device used for expanding monitors as described in claim 8, wherein, the bases of the said second monitor and third monitor are provided with fixation units and slot units; screen backboards of the second monitor and third monitor are provided with combination units, limitation units and limitation slots formed on the limitation unit; the drive module is fixed on the pedestal via its base, the fixation unit of the second monitor and the fixation unit of the third monitor; drive rod of the drive module is provided with thread segment used for pivotal coupling of the follow-up unit of the drive module, making the follow-up unit of the drive module to move reciprocally on the reference axis Z in response to the rotation of the drive rod; fixation unit of the third monitor is also connected to form an extension; pedestal of the third monitor is provided with a track used for holding a lug provided on the screen backboard of the third monitor; pedestal of the third monitor is provided with a rib of protruding structure; the follow-up unit of the drive module has mouths respectively used for holding the fixation unit of the second monitor and the fixation unit of the third monitor; follow-up unit and base of the drive module of the third monitor are respectively provided with at least one pivotal coupling end used for pivotal coupling of the reaction frame; the reaction frame comprises a main arm and an auxiliary arm; the main arm and the auxiliary arm respectively have a first end, a second end and a waist connected between the first end and the second end; the first end of the main arm is pivotally coupled with the pivotal coupling end of the follow-up unit of the drive module, the second end of the main arm is pivotally coupled with the pivotal coupling end of the combination unit of the second monitor and the combination unit of the third monitor; the first end of the auxiliary arm is pivotally coupled with the limitation slot of the limitation unit of the second monitor and the limitation slot of the limitation unit of the third monitor, and the second end of the auxiliary arm is pivotally coupled with the pivotal coupling end of the base of the drive module; and waist of the main arm and waist of the auxiliary arm are pivotally coupled via the spindle pin to form a fulcrum for the spindle, enabling the reaction frame to drive the second monitor and the third monitor to move on the reference axis Y.

19. The transmission device used for expanding monitors as described in claim 9, wherein, the bases of the said second monitor and third monitor are provided with fixation units and slot units; screen backboards of the second monitor and third monitor are provided with combination units, limitation units and limitation slots formed on the limitation unit;

the drive module is fixed on the pedestal via its base, the fixation unit of the second monitor and the fixation unit of the third monitor; drive rod of the drive module is provided with thread segment used for pivotal coupling of the follow-up unit of the drive module, making the follow-up unit of the drive module to move reciprocally on the reference axis Z in response to the rotation of the drive rod; fixation unit of the third monitor is also connected to form an extension; pedestal of the third monitor is provided with a track used for holding a lug provided on the screen backboard of the third monitor; pedestal of the third monitor is provided with a rib of protruding structure; the follow-up unit of the drive module has mouths respectively used for holding the fixation unit of the second monitor and the fixation unit of the third monitor; follow-up unit and base of the drive module of the third monitor are respectively provided with at least one pivotal coupling end used for pivotal coupling of the reaction frame; the reaction frame comprises a main arm and an auxiliary arm; the main arm and the auxiliary arm respectively have a first end, a second end and a waist connected between the first end and the second end; the first end of the main arm is pivotally coupled with the pivotal coupling end of the follow-up unit of the drive module, the second end of the main arm is pivotally coupled with the pivotal coupling end of the combination unit of the second monitor and the combination unit of the third monitor; the first end of the auxiliary arm is pivotally coupled with the limitation slot of the limitation unit of the second monitor and the limitation slot of the limitation unit of the third monitor, and the second end of the auxiliary arm is pivotally coupled with the pivotal coupling end of the base of the drive module; and waist of the main arm and waist of the auxiliary arm are pivotally coupled via the spindle pin to form a fulcrum for the spindle, enabling the reaction frame to drive the second monitor and the third monitor to move on the reference axis Y.

20. The transmission device used for expanding monitors as described in claim 10, wherein, the bases of the said second monitor and third monitor are provided with fixation units and slot units; screen backboards of the second monitor and third monitor are provided with combination units, limitation units and limitation slots formed on the limitation unit; the drive module is fixed on the pedestal via its base, the fixation unit of the second monitor and the fixation unit of the third monitor; drive rod of the drive module is provided with thread segment used for pivotal coupling of the follow-up unit of the drive module, making the follow-up unit of the drive module to move reciprocally on the reference axis Z in response to the rotation of the drive rod; fixation unit of the third monitor is also connected to form an extension; pedestal of the third monitor is provided with a track used for holding a lug provided on the screen backboard of the third monitor; pedestal of the third monitor is provided with a rib of protruding structure; the follow-up unit of the drive module has mouths respectively used for holding the fixation unit of the second monitor and the fixation unit of the third monitor; follow-up unit and base of the drive module of the third monitor are respectively provided with at least one pivotal coupling end used for pivotal coupling of the reaction frame; the reaction frame comprises a main arm and an auxiliary arm; the main arm and the auxiliary arm respectively have a first end, a second end and a waist connected between the first end and the second end; the first end of the main arm is pivotally coupled with the pivotal coupling end of the follow-up unit of the drive module, the second end of the main arm is pivotally coupled with the pivotal coupling end of the combination unit of the second monitor and the combination unit of the third monitor; the first end of the auxiliary arm is pivotally coupled with the limitation slot of the limitation unit of the second monitor and the limitation slot of the limitation unit of the third monitor, and the second end of the auxiliary arm is pivotally coupled with the pivotal coupling end of the base of the drive module; and waist of the main arm and waist of the auxiliary arm are pivotally coupled via the spindle pin to form a fulcrum for the spindle, enabling the reaction frame to drive the second monitor and the third monitor to move on the reference axis Y.

* * * * *